(12) United States Patent
Hosono

(10) Patent No.: US 6,841,314 B2
(45) Date of Patent: Jan. 11, 2005

(54) METHOD OF MANUFACTURING A PHOTOMASK

(75) Inventor: Kunihiro Hosono, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 198 days.

(21) Appl. No.: 10/162,082

(22) Filed: Jun. 5, 2002

(65) Prior Publication Data

US 2003/0082462 A1 May 1, 2003

(30) Foreign Application Priority Data

Nov. 1, 2001 (JP) .......................... 2001-336828

(51) Int. Cl.$^7$ ................................ G03F 9/00
(52) U.S. Cl. ..................... 430/5; 430/322; 430/323; 430/324
(58) Field of Search ............... 430/5, 322–324

(56) References Cited

FOREIGN PATENT DOCUMENTS

JP          03144452          6/1991

*Primary Examiner*—Geraldine Letscher
(74) *Attorney, Agent, or Firm*—Burns, Doane, Swecker & Mathis, L.L.P.

(57) ABSTRACT

Photomask blanks are fabricated by forming half-tone film over quartz substrate and causing a half-tone phase shift film to contain impurity becoming a color center by implanting ion at a predetermined depth of the half-tone film by means of ion-implantation. Using the above photomask blanks, a desired pattern is formed within photosensitive resist by applying photosensitive resist over the half-tone film thereover, exposing the resist through use of a desired pattern, and then developing the resist. Through the above photosensitive resist as a mask, the half-tone film is etched to form a predetermined pattern within the half-tone film. The exposed photosensitive resist is removed to fabricate a photomask.

5 Claims, 10 Drawing Sheets

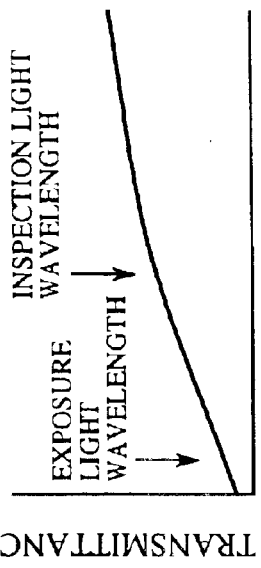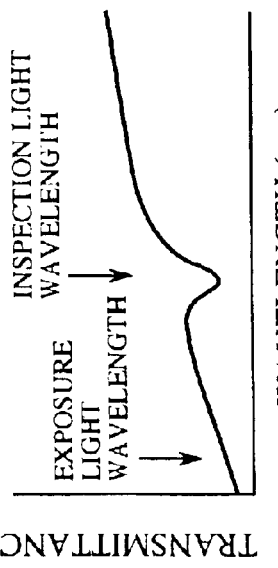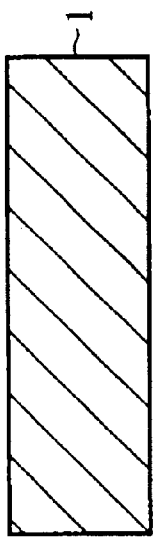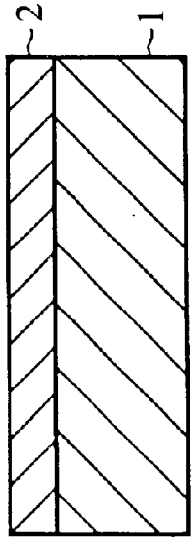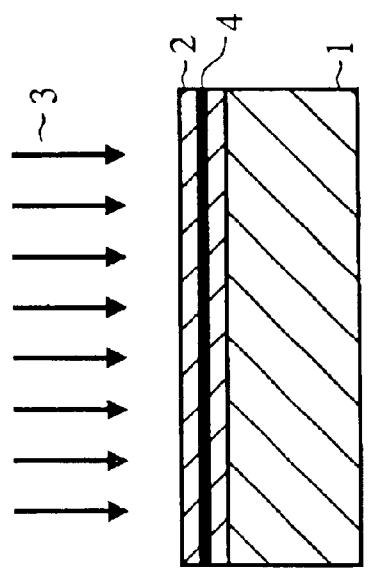

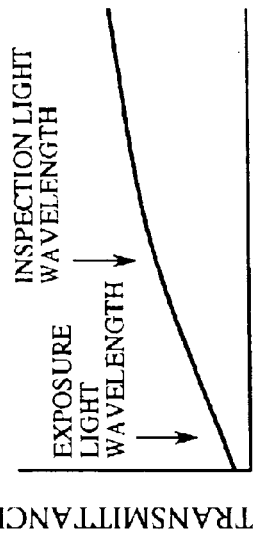
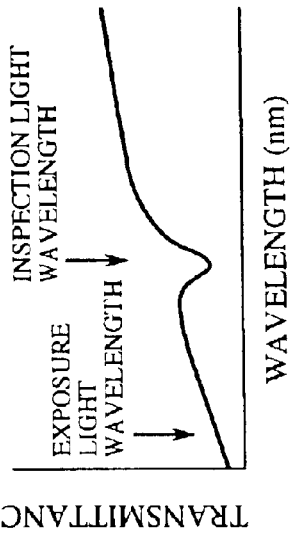
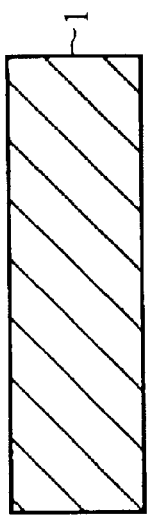
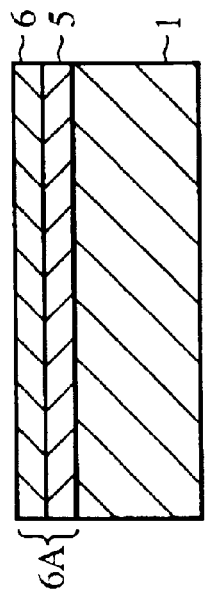
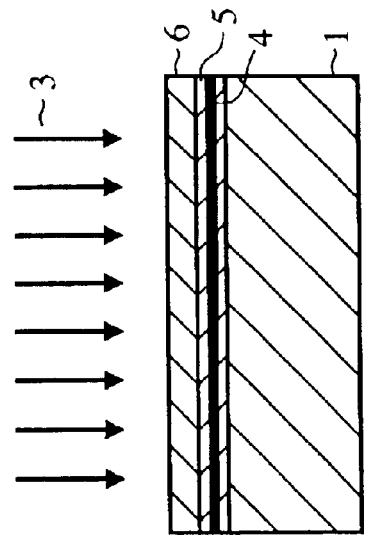

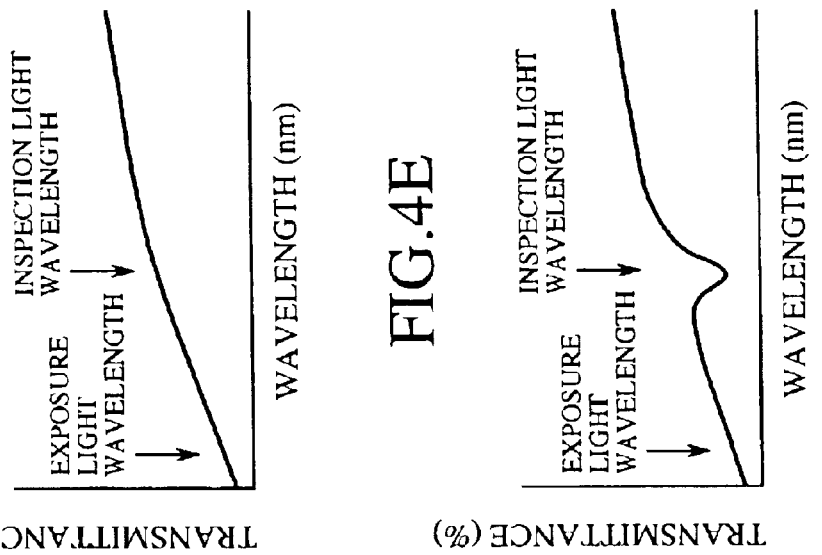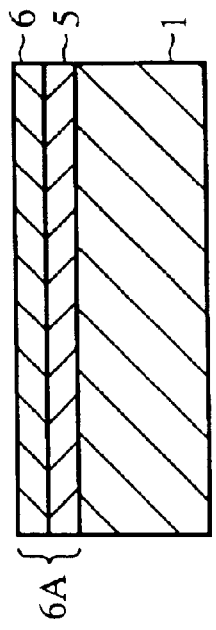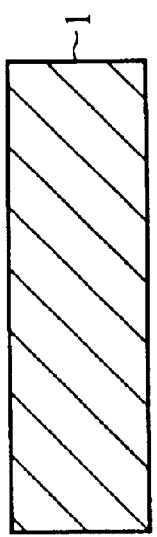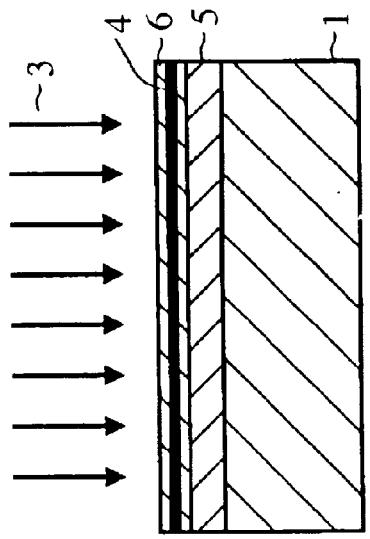

$\phi(L1-L2)=180°$

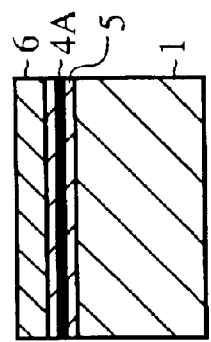
FIG.9A
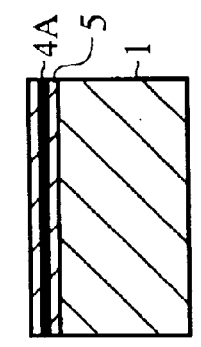
FIG.9B
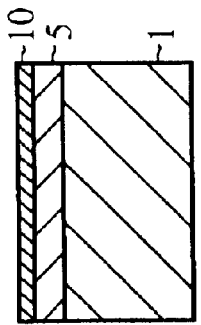
FIG.9C
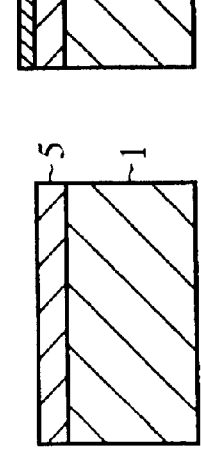
FIG.9D
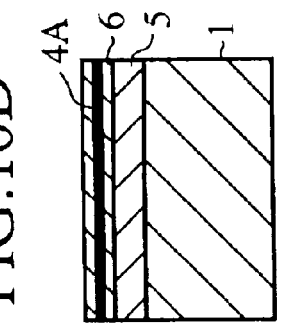
FIG.10A
FIG.10B
FIG.10C
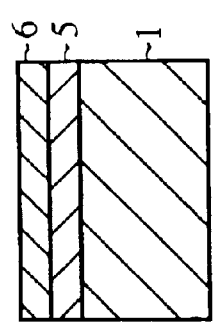
FIG.10D
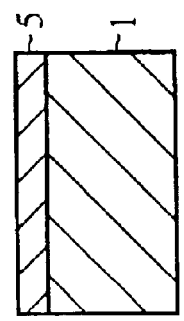
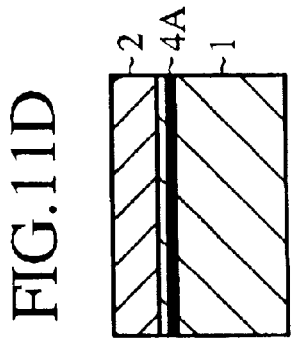
FIG.11A
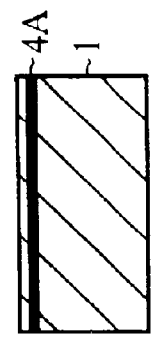
FIG.11B
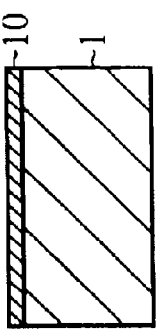
FIG.11C
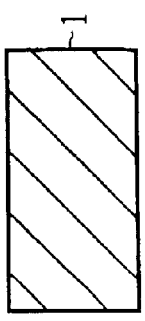
FIG.11D

PHASE INTENSITY

LIGHT INTENSITY

PHASE INTENSITY

LIGHT INTENSITY

METHOD OF MANUFACTURING A PHOTOMASK

BACKGROUND OF THE INVENTION

1. Field of the Invention

The present invention relates to a method of manufacturing a photomask. More particularly, it relates to photomask blanks used for manufacturing a phase shift mask used for the manufacture of a semiconductor device.

2. Description of Related Art

In general, when a semiconductor device such as a large-scale integrated circuit (LSI) is manufactured, a photomask having a predetermined pattern thereon is fabricated from photomask blanks, and then a wafer is microfabricated through use of the photomask. The above photomask blanks consists of a quartz substrate, for instance, and photomask material (photomask film).

When the photomask is manufactured from the photomask blanks, a photosensitive resist, for instance, is applied over the photomask material, and then the photosensitive resist is exposed to form a desired pattern therein. Subsequently, the photomask (material) is etched through use of the photosensitive resist as a mask, and then the photosensitive resist is removed to form a desired pattern on the photomask. When microfabricating a wafer (in other words, when exposing a wafer) it is necessary to perform a defect inspection, on the photomask pattern prior to the processing.

Recently, in order to fine-pattern the wafer for manufacturing a LSI, the wavelength of exposure light has been reduced, and optical systems for exposure have become much more sophisticated. In addition, so-called RET (resolution enhancement technology) has been used. Examples of RET include phase shift lithographic technologies (lithographic technology using a half tone type phase shift mask, a Levenson type phase shift mask, or a phase etch type phase shift mask), OPC (optical proximity correction) mask technology, and OAI (off-axis illumination) technology.

When using the phase shift lithographic technology among RETs, the pattern of a half tone mask (referred to as a HT mask hereinafter) is inspected for defects before fine-patterning the wafer through use of the HT mask as a photomask. At this time, the wavelength of inspection light used for the defect inspection of the HT mask pattern is longer than the wavelength of exposure light used for exposure in the lithographic process. For this reason, the mask material has higher transmittance at the inspection light wavelength than at the exposure light wavelength, which depends on the characteristic of the HT mask material. For instance, whereas an ArF lithographic 6% HT mask has a transmittance of 6% to the exposure light having a wavelength of 193 nm, the mask has a transmittance of 30–50% to the inspection light when the inspection light has a wavelength of 365 nm (i-line).

On the other hand, a HT mask substrate (quartz substrate) has a transmittance of about 90% to the exposure light and also to the inspection light regardless of their wavelengths. Therefore, because the ArF lithographic 6% HT mask pattern has a transmittance of 30–50% at the inspection light wavelength as mentioned above, the contrast between the HT mask pattern and the HT mask substrate at the inspection light wavelength is not sufficient when the defect inspection of the HT mask pattern is performed. In other words, because the conventional HT mask blanks has higher transmittance at the inspection light wavelength than at the exposure light wavelength, the contrast between the HT mask pattern and the HT mask substrate within the HT mask fabricated from this HT mask blanks is insufficient.

Because the conventional photomask blanks is constructed as described above, there has been a drawback that sufficient inspection sensitivity cannot be obtained when performing the defect inspection of the HT mask pattern because of the insufficient contrast between the HT mask pattern and the HT mask substrate at the inspection light wavelength. In extreme cases, the defect inspection of the HT mask pattern can be impossible.

Additionally, with an increase in the degree of microfabrication of the pattern, the reduction of the wavelength of exposure light in order to enhance the pattern resolution has been more required. However, for the HT mask pattern, the longer the wavelength of the light incident (the wavelength of exposure light or of inspection light) on the HT mask pattern is, the higher the transmittance thereof is. Therefore, the shorter the wavelength of the exposure light relative to the wavelength of the inspection light is (the larger the difference between the wavelength of the exposure light and the one of the inspection light is), the higher the transmittance of the inspection light is relatively. Therefore, when performing the defect inspection of the HT mask pattern, there has been a drawback that sufficient defect inspection cannot be carried out.

It is advantageous to increase the transmittance of the HT mask pattern in order to enhance the resolution of the exposure pattern (that is, to enhance the optical image contrast caused by the increase of HT phase shift effect). However, when the transmittance of the HT mask pattern is increased, sufficient defect inspection cannot be performed, in the defect inspection of the HT mask pattern, similarly to the above reason.

As described above, with the conventional photomask blanks, whereas the resolution is improved, there has been a drawback that the impossibility of performing the sufficient defect inspection results in causing the defects in the pattern on the wafer due to the pattern defects on the photomask blanks. That is, there has been a drawback that the defects caused in the exposure pattern formed on the wafer result in the deterioration of quality of the wafer in itself.

SUMMARY OF THE INVENTION

The present invention has been accomplished to solve the above-mentioned drawbacks. An object of the present invention is to provide a method of manufacturing a photomask causing few defects within an exposure pattern on a wafer in the exposure process.

According to an aspect of the present invention, there is provided with a method of manufacturing a photomask comprising: a first step for providing a half-tone film on a substrate, and preparing photomask blanks which has a half-tone film on a substrate and in which an impurity-implanted layer is formed in either the substrate or half-tone film; a second step in which a photosensitive resist is applied over said half-tone film; a third step in which the photosensitive resist is exposed through use of a predetermined pattern and developed to form the predetermined pattern within the photosensitive resist; and a fourth step in which the half-tone film is etched through use of the photosensitive resist as a mask to form the predetermined pattern within the half-tone film.

Thus, the photomask blanks has the half-tone film and/or substrate having an impurity becoming a color center at a predetermined depth, thereby reducing the transmittance to the inspection light.

BRIEF DESCRIPTION OF THE DRAWINGS

FIGS. 1A–1E are illustrations of the manufacture of photomask blanks according to an embodiment 1 of the present invention;

FIGS. 3A–3E are illustrations of the manufacture of photomask blanks according to an embodiment 2 of the present invention;

FIGS. 4A–4E are illustrations of the manufacture of photomask blanks according to an embodiment 3 of the present invention;

FIGS. 9A–9D are illustrations of the manufacture of photomask blanks according to the embodiment 5 of the present invention;

FIGS. 10A–10D are illustrations of the manufacture of photomask blanks according to the embodiment 5 of the present invention;

FIGS. 11A–11D are illustrations of the manufacture of photomask blanks according to the embodiment 5 of the present invention;

DETAILED DESCRIPTION OF THE PREFERRED EMBODIMENTS

Figure 2A:
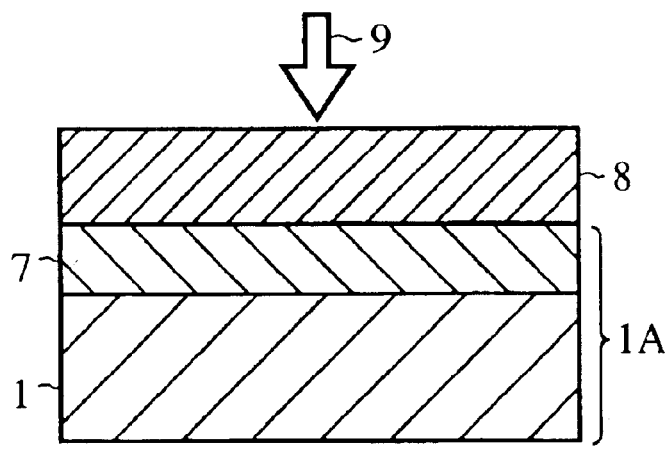
FIGS. 2A–2D are illustrations of the manufacture of a photomask by use of the photomask blanks shown in FIGS. 1A–1E.

An embodiment of the present invention will be described below.

Embodiment 1

Referring to FIGS. 1A–1E, quartz substrate 1 is prepared as a substrate for fabricating photomask blanks (FIG. 1A). A half-tone film material serving as a photomask pattern material is deposited over quartz substrate 1, to thereby form half-tone phase shift film 2 (FIG. 1B). Examples of the half-tone film material include metals and metallic silicides (for instance, Cr and MoSi) as abaser metal, and the oxides, nitrides, oxynitrides, and fluorides thereof. The thickness of half-tone phase shift film 2 is 100 nm–300 nm, and half-tone phase shift film 2 is optimized so that the phase shift between the light transmitted by half-tone phase shift film 2 and the light not transmitted by half-tone phase shift film 2 at the exposure light wavelength used in the lithographic process is 180°. Under the above-described condition, that is, under the condition shown in FIG. 1B, the transmittances to the exposure light and to the inspection light were measured, and the results are shown in FIG. 1C. As shown in the figure, the transmittance is higher at the inspection light wavelength than at the exposure light wavelength. For instance, the transmittance to the exposure light having a wavelength of 193 nm is about 6%, while the transmittance to the inspection light having a wavelength of about 360 nm is about 50%.

An impurity is implanted into half-tone phase shift film 2. The impurity is implanted into the predetermined depth (position), for instance, or the local depth of half tone phase shift film 2. For instance, as shown in FIG. 1D, ion 3 is implanted as an impurity from the surface of half-tone phase shift film 2 by means of ion implantation. At that time, ion 3 is implanted into the predetermined depth (over the predetermined depth range) of half-tone phase shift film 2 in a belt shape and forms impurity-implanted layer 4.

Used as ion 3 are optically active ions (that is, ions serving as a color center) such as, for instance, alkali metal (Li, Na, K, etc.) ions, alkaline-earth metal (Be, Mg, Ca, etc.) ions, and halogen ions. Implantation of ion 3 hardly changes the transmittance at the exposure light wavelength, but can reduce the transmittance at the defect inspection light wavelength when carrying out the pattern defect inspection of the photomask fabricated by use of this photomask blanks, as described later.

Whereas the transmittance to the exposure light having a wavelength of 193 nm was 6%, and the transmittance to the inspection light having a wavelength of about 360 nm was 50% prior to the ion implantation, the transmittance at the inspection light wavelength reduced to the order of 20% after the ion implantation of the order of $10^{15}$–$10^{19}$ ions/cm$^2$ was performed. In addition, whereas the transmittance to the exposure light having a wavelength of 157 nm was 6%, and the transmittance to the inspection light having a wavelength of about 250 nm was 60% prior to the ion implantation, the transmittance to the inspection light reduced to the order of 25% after ion implantation of the order of $10^{15}$–$10^{19}$ ions/cm$^2$ was done.

Thus, when the ions are implanted into the predetermined depth in half-tone phase shift film 2 or into the local depth in half-tone phase shift film 2, the transmittance at the inspection light wavelength can be reduced (Refer to FIG. 1E). In other words, the transmittance to the inspection light can be reduced relatively to the exposure light. Because impurity-implanted layer 4 is formed by means of the ion implantation, composition/structure not obtained by means of chemical reaction in thermal equilibrium can be obtained.

In addition, heat treatment can be done after the ion implantation. The depth of the ions to be implanted is adjusted to a predetermined depth or a local depth corresponding to the thickness and the concentration of implanted ions of half-tone phase shift film 2.

The manufacture of the phase shift mask by use of the above photomask blanks will next be described. Referring to FIGS. 2A–2D, the photomask blanks is designated by the numeral 1A, and the ion-implanted half-tone phase shift film is designated by the numeral 7. First of all, photosensitive resist 8 is applied over half-tone phase shift film 7 to a predetermined thickness, and then photosensitive resist 8 is exposed to irradiation of laser beam or electric charge beam (electron beam) 9 to thereby expose photosensitive resist 8 in a desired pattern shape (FIG. 2A).

Figure 2B:
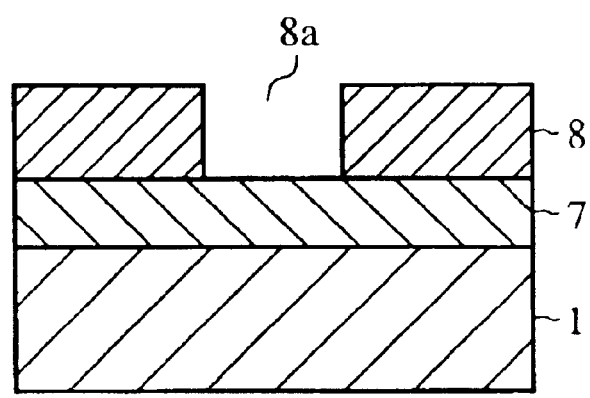
Figure 2C:
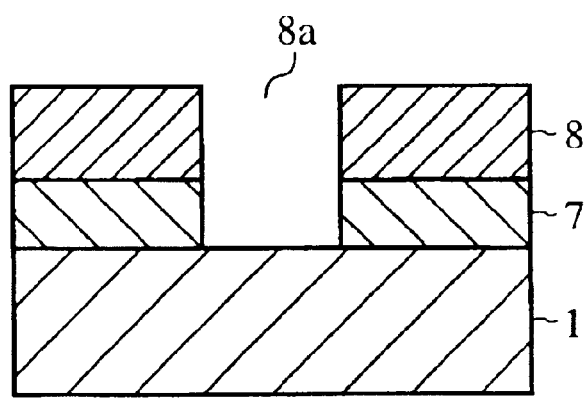
Figure 2D:
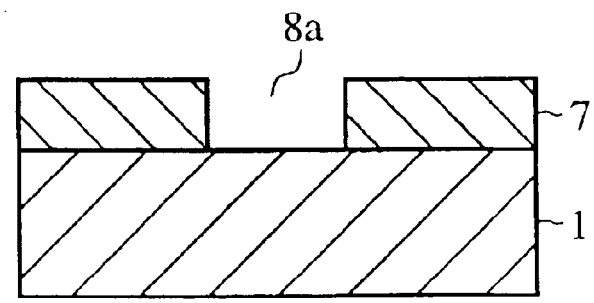

Then, photosensitive resist 8 is developed, to thereby form a desired pattern 8a within photosensitive resist 8 (FIG. 2B). Subsequently, half-tone phase shift film 7 is etched through use of photosensitive resist 8 as a mask, to thereby form a desired pattern 8a within half-tone phase shift film 7 (FIG. 2C). Photosensitive resist 8 is removed, and thereby a phase shift mask having a desired pattern 8a formed therein is obtained (FIG. 2D).

The above phase shift mask has a phase shift pattern having low transmittance at the inspection light wavelength. Therefore, when the inspection process for the phase shift mask is carried out by use of a transmission defect inspector using light (laser), for instance, the increased contrast between the transmitting part (quartz substrate) and the phase shift pattern results in the increase of inspection sensitivity, and thereby enables the detection of micro-pattern defects.

As mentioned above, according to the embodiment 1, because ions are implanted as impurities into the half-tone phase shift film of the photomask blanks at the predetermined depth or local depth, the transmittance at the inspection light wavelength can be reduced. When a photomask is manufactured by use of the photomask blanks, minute pattern defects can be detected. As a result, few defects are caused within the exposed pattern in the wafer exposure process.

Embodiment 2

Referring to FIGS. 3A–3E, quartz substrate 1 is prepared as a substrate for fabricating photomask blanks (FIG. 3A). Transmittance-adjusting layer 5 is formed over quartz substrate 1, and then phase-shift-adjusting layer 6 is formed over transmittance-adjusting layer 5 (FIG. 3B). In other words, half-tone film materials that are photomask pattern materials are serially deposited, to thereby form multilayer type half-tone film 6A. As described referring to FIGS. 1A–1E, examples of the half-tone film material include metals and metallic silicides (for instance, Cr and MoSi) as a base metal, and the oxides, nitrides, oxynitrides, and fluorides thereof (Additionally, transparent type phase shift material such as $SiO_2$ may be used as phase-shift-adjusting layer 6). The thickness of multilayer type half-tone film 6A is 150–400 nm, and multilayer type half-tone film 6A is optimized so that the phase shift between the light transmitted through multilayer type half-tone film 6A and the light not transmitted through multilayer type half-tone film 6A to the exposure light used in the lithographic process may be 180°. Under the above-described condition, that is, under the condition shown in FIG. 3B, the transmittances to the exposure light and to the inspection light were measured, and the results are shown in FIG. 3C. As shown in the figure, the transmittance is higher at the inspection light wavelength than at the exposure light wavelength. For instance, the transmittance to the exposure light having a wavelength of 193 nm is about 6%, while the transmittance to the inspection light having a wavelength of about 360 nm is about 50%.

An impurity is implanted into multilayer type half-tone film 6A. The impurity is implanted into the predetermined depth (position) or the local depth of multilayer type half-tone film 6A. To be more precise, as shown in FIG. 3D, ion 3 is implanted as an impurity from the surface of multilayer type half-tone film 6A by means of ion implantation to form impurity-implanted layer 4 in a belt shape within transmittance-adjusting layer 5. As described referring to FIGS. 1A–1E, examples of ions used as ion 3 include optically active ions (that is, ions serving as a color center) such as alkali metal (Li, Na, K, and so on) ions, alkaline-earth metal (Be, Mg, Ca, and so on) ions, and halogen ions. Implantation of ion 3 hardly changes the transmittance to the exposure light, but can reduce the transmittance to the defect inspection light when carrying out the pattern defect inspection of the photomask fabricated by use of this photomask blanks.

Whereas the transmittance to the exposure light having a wavelength of 193 nm was 6% and the transmittance to the inspection light having a wavelength of about 360 nm was 50% prior to the ion implantation, the transmittance to the inspection light reduced to the order of 20% after ion implantation of the order of $10^{15}$–$10^{19}$ ions/cm$^2$ was performed. In addition, whereas the transmittance to the exposure light having a wavelength of 157 nm was 6%, and the transmittance to the inspection light having a wavelength of about 250 nm was 60% prior to the ion implantation, the transmittance to the inspection light reduced to the order of 25% after ion implantation of the order of $10^{15}$–$10^{19}$ ions/cm$^2$ was done.

Thus, when the ions are implanted into the predetermined depth of multilayer type half-tone film 6A or into the local depth of multilayer type half-tone film 6A (that is, when the ions are implanted into transmittance-adjusting layer 5), the transmittance at the inspection light wavelength can be reduced (Refer to FIG. 3E). In other words, the transmittance to the inspection light can be reduced relatively to the exposure light. Because impurity-implanted layer 4 is formed by means of the ion implantation, composition/structure not obtained from chemical reaction in thermal equilibrium can be obtained.

In addition, heat treatment can be done after the ion implantation. The depth into which the ions are implanted is adjusted to the predetermined depth or the local depth corresponding to the thickness and the concentration of implanted ions of multilayer type half-tone film 6A. In addition, multilayer type half-tone film 6A may be formed by means of forming phase-shift-adjusting layer 6 over substrate 1 and then forming transmittance-adjusting layer 5 over phase-shift-adjusting layer 6. The multilayer half-tone film may be also formed by means of combining three or more layers of phase-shift-adjusting layer 6 and transmittance-adjusting layer 5. In addition, the ions may be implanted into a multilayer containing transmittance-adjusting layer 5 and phase-shift-adjusting layer 6. In either case, it is essential only that the transmittance to the inspection light be reduced.

When manufacturing a phase shift mask by use of the photomask blanks described referring to FIGS. 3A–3E, the phase shift mask is manufactured as described referring to FIGS. 2A–2D. At that time, the photomask blanks described referring to FIGS. 3A–3E is used instead of photomask blanks 1A.

As mentioned above, according to the embodiment 2, because ions are implanted as impurities into the transmittance-adjusting layer of multilayer type half-tone film within the photomask blanks, the transmittance to the inspection light can be reduced. When a photomask is manufactured by use of the photomask blanks, minute pattern defects can be detected. Therefore, few defects are caused within the exposed pattern in the wafer exposure process.

Embodiment 3

Referring to FIGS. 4A–4E, quartz substrate 1 is prepared as a substrate for fabricating photomask blanks (FIG. 4A). Transmittance-adjusting layer 5 is formed over quartz substrate 1, and then phase-shift-adjusting layer 6 is formed over transmittance-adjusting layer 5 (FIG. 4B). In other words, half-tone film materials that are photomask pattern materials are serially deposited, to thereby form multilayer type half-tone film 6A. The materials described referring to FIGS. 3A–3E are used as the half-tone film material. Under the above-described condition, that is, under the condition shown in FIG. 4B, the transmittances to the exposure light and to the inspection light were measured, and the results are shown in FIG. 4C. As shown in the figure, the transmittance is higher to the inspection light than to the exposure light. For instance, the transmittance to the exposure light having a wavelength of 193 nm is about 6%, while the transmittance to the inspection light having a wavelength of about 360 nm is about 50%.

An impurity is implanted into multilayer type half-tone film 6A. The impurity is implanted into the predetermined depth (position) or the local depth of multilayer type half-tone film 6A. To be more precise, as shown in FIG. 4D, ion 3 is implanted as an impurity from the surface of multilayer type half-tone film 6A by means of ion implantation to form impurity-implanted layer 4 in a belt shape within phase-shift-adjusting layer 6. The optically active ions described referring to FIG. 3D are used as ion 3. The implantation of ion 3 hardly changes the transmittance to the exposure light, but can reduce the transmittance to the defect inspection light when carrying out the pattern defect inspection of the photomask fabricated by use of this photomask blanks.

Whereas the transmittance to the exposure light having a wavelength of 193 nm was 6% and the transmittance to the inspection light having a wavelength of about 360 nm was 50% before the ion implantation, the transmittance to the inspection light reduced to the order of 20% after ion implantation of the order of $10^{15}$–$10^{19}$ ions/cm$^2$ was performed. In addition, whereas the transmittance to the exposure light having a wavelength of 157 nm was 6%, and the transmittance to the inspection light having a wavelength of about 250 nm was 60% before the ion implantation, the transmittance to the inspection light reduced to the order of 25% after ion implantation of $10^{15}$–$10^{19}$ ions/cm$^2$ was done.

Thus, when the ions are implanted into the predetermined depth of multilayer type half-tone film 6A or into the local depth of multilayer type half-tone film 6A (that is, when the ions are implanted into phase-shift-adjusting layer 6), the transmittance to the inspection light can be reduced (Refer to FIG. 4E). Because impurity-implanted layer 4 is formed by means of the ion implantation, a composition/structure not obtained from chemical reaction in thermal equilibrium can be obtained.

In addition, heat treatment can be done after the ion implantation. The depth into which the ions are implanted is adjusted to the predetermined depth or the local depth corresponding to the thickness and the concentration of implanted ions of multilayer type half-tone film 6A. Additionally, multilayer type half-tone film 6A may be formed by means of forming phase-shift-adjusting layer 6 over substrate 1 and then forming transmittance-adjusting layer 5 over phase-shift-adjusting layer 6.

When manufacturing a phase shift mask by use of the photomask blanks described referring to FIGS. 4A–4E, the phase shift mask is manufactured as described referring to FIGS. 2A–2D. At that time, the photomask blanks described referring to FIGS. 4A–4E is used instead of photomask blanks 1A.

As mentioned above, according to the embodiment 3, because ions are implanted as impurities into the phase-shift-adjusting layer of multilayer type half-tone film within the photomask blanks, the transmittance to the inspection light can be reduced. When a photomask is manufactured by use of the photomask blanks, minute pattern defects can be detected. Therefore, few defects are caused within the exposed pattern in the wafer exposure process.

Embodiment 4

Figure 5C:
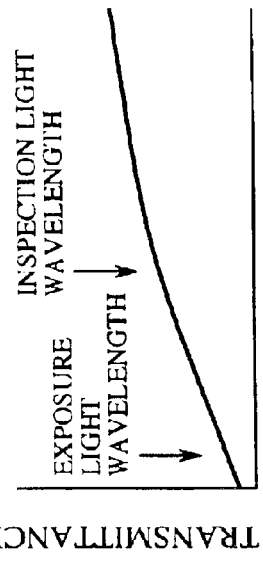
FIGS. 5A–5E are illustrations of the manufacture of photomask blanks according to an embodiment 4 of the present invention.
Figure 5E:
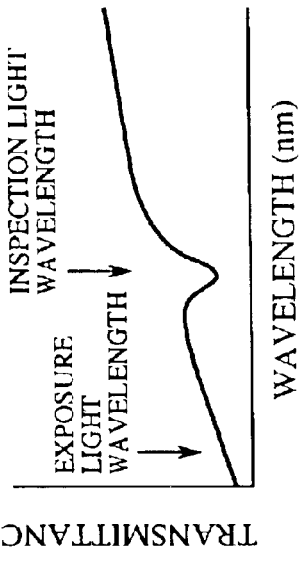
Figure 5A:
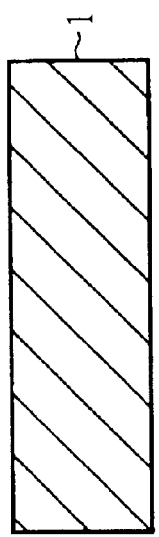
Figure 5B:
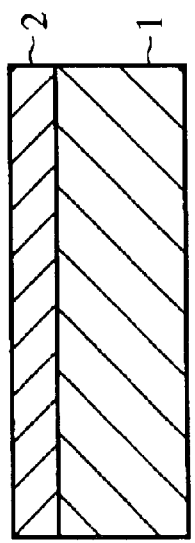

Referring to FIGS. 5A–5E, quartz substrate 1 is prepared as a substrate for fabricating photomask blanks (FIG. 5A). A half-tone film material that is a photomask pattern material is deposited over quartz substrate 1 to form half-tone phase shift film 2 (FIG. 5B). The materials described referring to FIGS. 1A–1E are used as the half-tone film material. Under the above-described condition, that is, under the condition shown in FIG. 5B, the transmittances to the exposure light and to the inspection light were measured, and the results are shown in FIG. 5C. As shown in the figure, the transmittance is higher to the inspection light than to the exposure light. For instance, the transmittance to the exposure light having a wavelength of 193 nm is about 6%, while the transmittance to the inspection light having a wavelength of about 360 nm is about 50%.

Figure 5D:
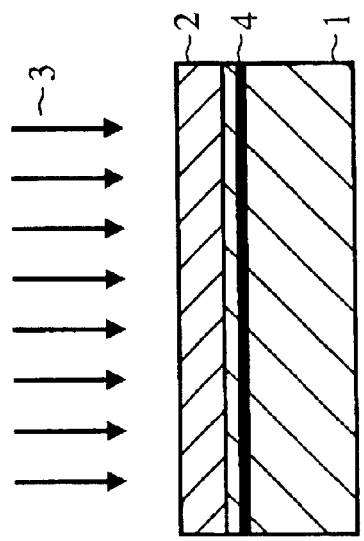

An impurity is implanted into the photomask blanks. The impurity is implanted into the predetermined depth (position) or the local depth of quartz substrate 1. (In the depicted example, ion 3 is implanted into the upper part within quartz substrate 1.) For instance, as shown in FIG. 5D, ion 3 is implanted as an impurity from the surface of half-tone phase shift film 2 by means of ion implantation. At that time, ion 3 is implanted in a belt shape into the predetermined depth (into the predetermined depth range) of quartz substrate 1, to thereby form impurity-implanted layer 4. The optically active ions described referring to FIG. 1D are used as ion 3. Implantation of ion 3 hardly changes the transmittance to the exposure light, but can reduce the transmittance to the defect inspection light when carrying out the pattern defect inspection of the photomask fabricated by use of this photomask blanks.

Whereas the transmittance to the exposure light having a wavelength of 193 nm was 6% and the transmittance to the inspection light having a wavelength of about 360 nm was 50% before the ion implantation, the transmittance to the inspection light reduced to the order of 20% after ion implantation of the order of $10^{15}$–$10^{19}$ ions/cm$^2$ was performed. In addition, whereas the transmittance to the exposure light having a wavelength of 157 nm was 6%, and the transmittance to the inspection light having a wavelength of about 250 nm was 60% before the ion implantation, the transmittance to the inspection light reduced to the order of 25% after ion implantation of $10^{15}$–$10^{19}$ ions/cm$^2$ was done.

Thus, when the ions are implanted into the predetermined depth of quartz substrate 1 or into the local depth of quartz substrate 1, the transmittance to the inspection can be reduced (Refer to FIG. 5E). That is, the transmittance to the inspection light can be reduced relatively to the exposure light. Because impurity-implanted layer 4 is formed by means of ion implantation, composition/structure not obtained from chemical reaction in thermal equilibrium can be achieved. In addition, heat treatment can be done after the ion implantation.

The manufacture of the phase shift mask by use of the above photomask blanks will next be described.

Figure 6A:
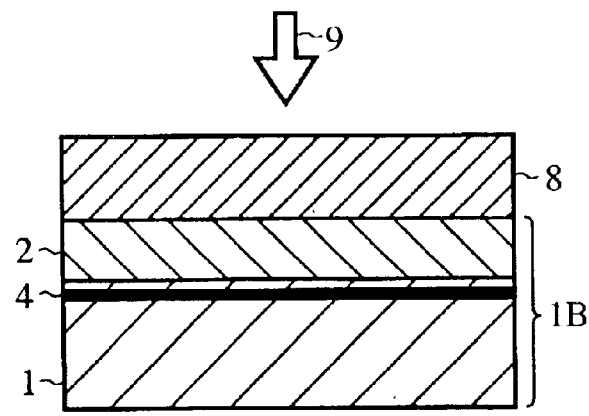
FIGS. 6A–6E are illustrations of the manufacture of a photomask by use of the photomask blanks shown in FIGS. 5A–5E.

Referring to FIGS. 6A–6E, the photomask blanks is designated by the numeral 1B. First of all, photosensitive resist 8 is applied over half-tone phase shift film 2 to a predetermined thickness, and then photosensitive resist 8 is exposed to irradiation of laser beam or charged beam (electron beam) 9 to expose photosensitive resist 8 in a desired pattern shape (FIG. 6A).

Figure 6B:
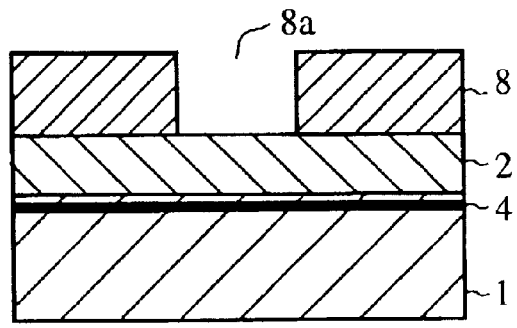
Figure 6C:
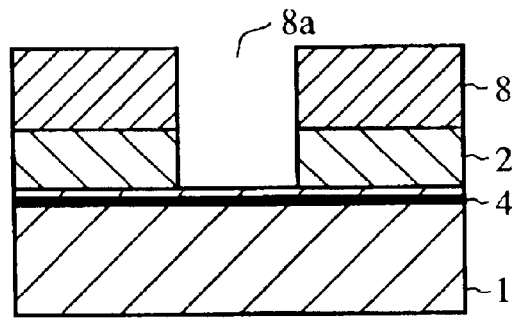
Figure 6D:
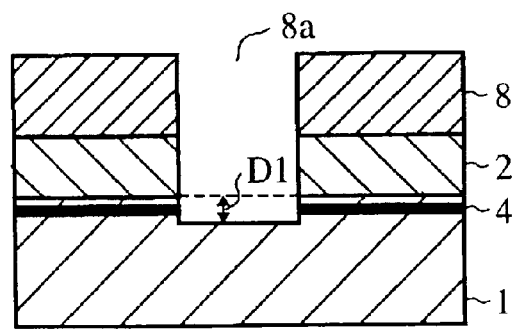
Figure 6E:
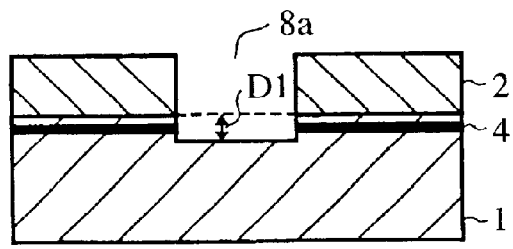

After that, photosensitive resist 8 is developed, to thereby form a desired pattern 8a within photosensitive resist 8 (FIG. 6B). Half-tone phase shift film 2 is etched through use of photosensitive resist 8 as a mask, to thereby form a desired pattern 8a within half-tone phase shift film 2 (FIG. 6C). Subsequently, quartz substrate 1 is etched by a thickness of D1 through use of photosensitive resist 8 and half-tone phase shift film 2 as a mask (FIG. 6D). Photosensitive resist 8 is removed, and thereby a phase shift mask having a desired pattern 8a formed therein is obtained (FIG. 6E).

Figure 7A:
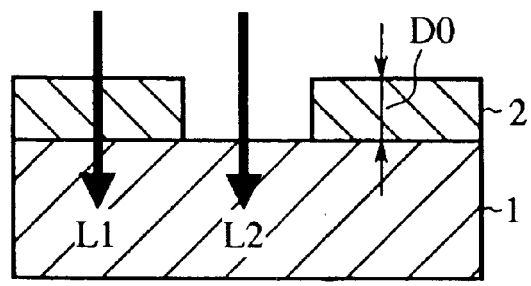
FIGS. 7A and 7B are illustrations of a photomask manufactured by use of the photomask blanks shown in FIGS. 5A–5E.
Figure 7B:
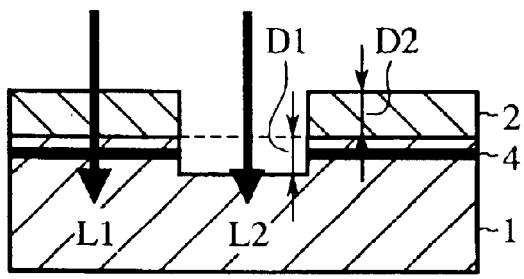

Referring to FIGS. 7A and 7B, in general, when light having an exposure light wavelength is irradiated to a phase shift mask in lithographic process, phase shift $\phi$ (L1–L2) between light L1 transmitted by half-tone phase shift film 2 (containing quartz substrate 1) and light L2 transmitted by the transmitting part (quartz substrate 1) is 180° (Refer to FIG. 7A). In other words, thickness D0 of half-tone phase shift film 2 is defined so that the phase shift$\phi$ is 180°. In contrast, for the photomask blanks described referring to FIGS. 5A–5E, thickness D2 of half-tone phase shift film 2 and the above depth D1 removed by etching is defined so that the phase shift $\phi$ (L1–L2) between light L1 and light L2 with the phase shift mask described referring to FIGS. 6A–6E is 180°. Thickness D2 of half-tone phase shift film 2 and above depth D1 to be removed by etching is defined so that the phase shift $\phi$ is 180° under the condition of thickness D2 and etching depth D1. In addition, the depth to be ion-implanted is adjusted at a predetermined depth or a local depth corresponding to etching depth D1 and the concentration of implanted ions. At that time, it is required that impurity-implanted layer 4 in the etching area is completely removed by the etching of quartz substrate 1.

The above phase shift mask has a phase shift pattern having low transmittance at the inspection light wavelength. Therefore, when the inspection process of the phase shift mask is carried out by use of a transmission defect inspector using light (laser), the increased contrast between the transmitting part (quartz substrate) and the phase shift pattern results in the increase of inspection sensitivity. Thus, even micro-pattern defects can be detected.

As mentioned above, according to the embodiment 4, because ions are implanted as impurities into the photomask blanks at the predetermined depth or local depth of the quartz substrate, the transmittance to the inspection light can be reduced. When a photomask is manufactured by use of the photomask blanks, micro-pattern defects can be detected. As a result, few defects are caused within the exposed pattern in the wafer exposure process.

Embodiment 5

In the above embodiments 1–4, examples in which ions (impurities) are implanted into the photomask blanks by means of ion implantation were described. However, impurity layer 4A may be formed within the photomask blanks by means of methods illustrated in FIGS. 8A–11D.

Figure 8A:
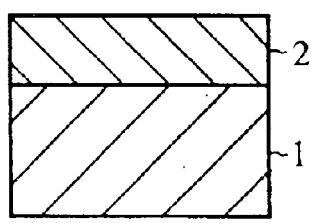
FIGS. 8A–8C are illustrations of the manufacture of photomask blanks according to an embodiment 5 of the present invention.
Figure 8B:
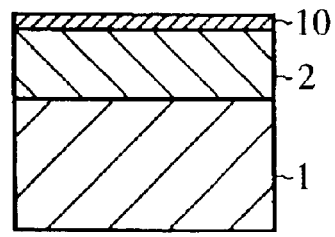
Figure 8C:
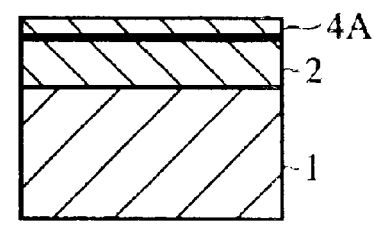

In FIGS. 8A–8C, first of all, half-tone phase shift film 2 is deposited over quartz substrate 1 (FIG. 8A). After that, impurity material 10 is thinly deposited over half-tone phase shift film 2 (predeposition) (FIG. 8B). Impurity material 10 is selected from optically active materials such as alkali metals (Li, Na, K, and the like), alkaline-earth metals (Be, Mg, Ca, and the like), and halogens. The substrate having half-tone phase shift film 2 and impurity material 10 is subjected to high temperature heat treatment at 400° C. or more, to thereby diffuse impurity material 10 into half-tone phase shift film 2 and form impurity layer 4A (driving) (FIG. 8C). At that time, the heat-treating time and the processing temperature are adjusted so that impurity layer 4A can be formed by diffusion at a predetermined depth or a local depth of half-tone phase shift film 2.

In FIGS. 9A–9D, first of all, transmittance-adjusting layer 5 is formed over quartz substrate 1 (FIG. 9A). Impurity material 10 is thinly deposited over transmittance-adjusting layer 5 (FIG. 9B). Then, the substrate having transmittance-adjusting layer 5 and impurity material 10 is subjected to high-temperature heat treatment at 400° C. or more, to thereby diffuse impurity material 10 into transmittance-adjusting layer 5 and form impurity layer 4A (FIG. 9C). At that time, the heat-treating time and the processing temperature are adjusted so that impurity layer 4A can be formed by diffusion at a predetermined depth or a local depth of transmittance-adjusting layer 5. Subsequently, phase-shift-adjusting layer 6 is formed over transmittance-adjusting layer 5, to thereby form multilayer type half-tone film 6A (FIG. 9D).

In FIGS. 10A–10D, first of all, transmittance-adjusting layer 5 is formed over quartz substrate 1 (FIG. 10A). Phase-shift adjusting layer 6 is formed over transmittance-adjusting layer 5, to thereby form multilayer type half-tone film 6A (FIG. 10B). Impurity material 10 is thinly deposited over phase-shift adjusting layer 6 (FIG. 10C). The substrate having these layers and the material is subjected to high-temperature heat treatment at 400° C. or more, to thereby diffuse impurity material 10 into phase-shift-adjusting layer 6 and form impurity layer 4A (FIG. 10D). At that time, the heat-treating time and the processing temperature are adjusted so that impurity layer 4A can be formed by diffusion at a predetermined depth or a local depth of phase-shift-adjusting layer 6.

In FIGS. 11A–11D, quartz substrate 1 is first prepared (FIG. 11A), and impurity material 10 is thinly deposited over quartz substrate 1 (FIG. 11B). The substrate having the material is subjected to high-temperature heat treatment at 400° C. or more, to thereby diffuse impurity material 10 into quartz substrate 1 and form impurity layer 4A (FIG. 11C). At that time, the heat-treating time and the processing temperature are adjusted so that impurity layer 4A is formed by diffusion at a predetermined depth or a local depth of quartz substrate 1. Then, half-tone phase shift film 2 is deposited over quartz substrate 1 (FIG. 11D).

The transmittance to the inspection light can be also reduced by means of forming impurity layer 4A within the photomask blanks as mentioned above.

As described above, the transmittance at the inspection light wavelength can be also reduced according to the embodiment 5. When a photomask is manufactured by use of the photomask blanks, minute pattern defects can be detected. Therefore, few defects are caused within the exposed pattern in the wafer exposure process.

Figure 12A:
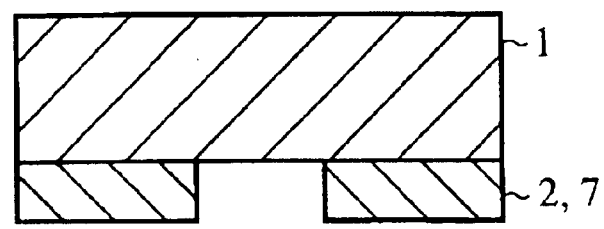
FIGS. 12A–12C are figures showing the characteristic of a photomask fabricated by use of the photomask blanks according to the present invention.
Figure 12B:
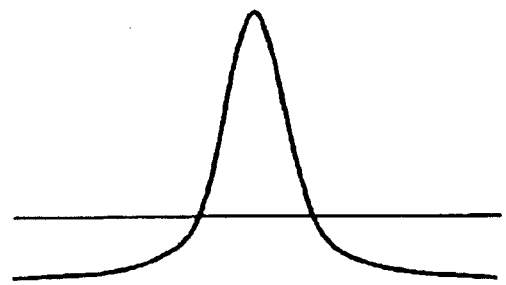
Figure 12C:
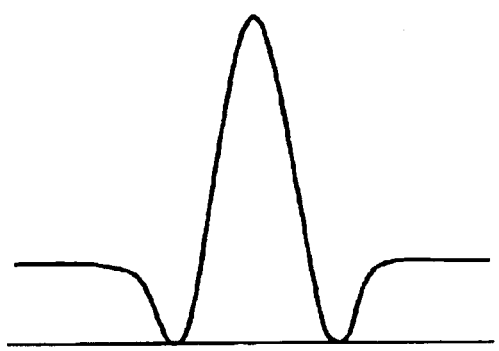
Figure 13A:
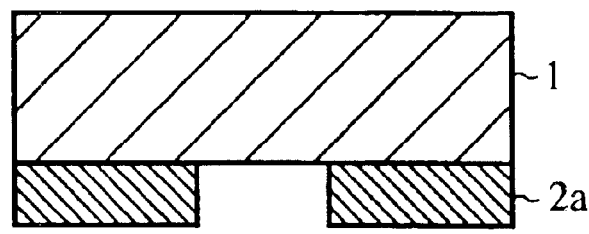
FIGS. 13A–13C are figures explaining the characteristic of a conventional photomask.

Comparisons of the phase shift masks using the photomask blanks described according to the embodiments 1–5 and a conventional phase shift mask will next be discussed. FIGS. 12A–12C are figures for describing the phase shift masks using the photomask blanks described according to the embodiments 1–5, and FIGS. 13A–13C are figures for describing the conventional phase shift mask.

In FIGS. 12A–12C, the phase shift mask using the photomask blanks described in Embodiment 1 is shown in FIG. 12A. In FIGS. 13A–13C, the conventional phase shift mask having phase shift film 2a is shown. In the phase shift mask shown in FIG. 12A, because the transmittance to the inspection light can be relatively reduced as mentioned above, the wavelength of the exposure light may be further shorten, and further the transmittance of half-tone phase shift films 2 and 7 to the exposure light may be made higher.

Figure 13B:
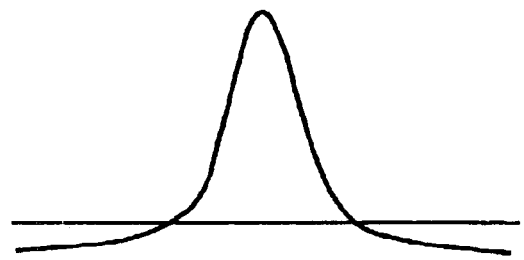
Figure 13C:
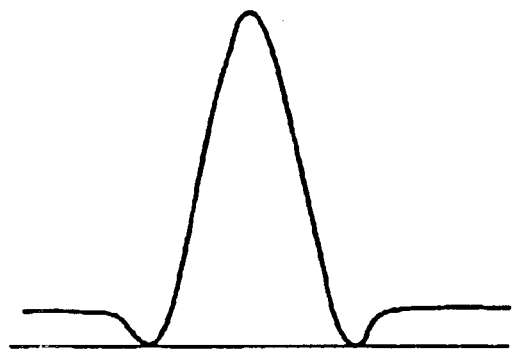

As shown in FIG. 12B and FIG. 13B, the effect of phase shift in the phase shift mask shown in FIG. 12A is higher than the effect in the conventional phase shift mask. As a result, the contrast of phase intensity therein is high. In addition, as shown in FIG. 12C and FIG. 13C, the effect of phase shift in the phase shift mask shown in FIG. 12A is higher than the effect in the conventional phase shift mask. As a result, the contrast of light intensity therein is high.

Thus, when the photomask blanks described according to the embodiments 1–5 are used, the transmittance to the inspection light relatively reduces. As a result, the wavelength of exposure light can be not only reduced, but also the transmittance of the half-tone film to the exposure light can be increased. Accordingly, the phase shift exposure with high optical resolution can be performed.

What is claimed is:

1. A method of manufacturing a photomask comprising:

a first step for providing a half-tone film on a substrate, and preparing photomask blanks in which an impurity-implanted layer is formed in either said substrate or said half-tone film;

a second step in which a photosensitive resist is applied over said half-tone film;

a third step in which said photo sensitive resist is exposed through use of a predetermined pattern and developed to form the predetermined pattern within said photosensitive resist; and a fourth step in which said half-tone film is etched through use of said photosensitive resist as a mask to form the predetermined pattern within said half-tone film.

2. The method of manufacturing a photomask according to claim 1, further comprising a fifth step in which the substrate is etched through use of the photosensitive resist and the half-tone film as a mask to a predetermined depth that is deeper than the depth previously determined based on the thickness of the half-tone film after the fourth step.

3. The method of manufacturing a photomask according to claim 1, wherein the half-tone film of the photo blanks prepared in the first step has a transmittance-adjusting layer and a phase-shift-adjusting layer, and wherein the impurity-implanted layer is formed in either said transmittance-adjusting layer or said phase-shift-adjusting layer.

4. The method of manufacturing a photomask according to claim 1, wherein the impurity is an optically active ion implanted by means of ion implantation.

5. The method of manufacturing a photomask according to claim 1, wherein the impurity is an optically active substance diffused by means of thermal diffusion.

* * * * *